United States Patent
Nguyen et al.

(10) Patent No.: US 12,197,834 B2
(45) Date of Patent: Jan. 14, 2025

(54) REDUCING RESOURCES IN QUANTUM CIRCUITS

(71) Applicant: The Boeing Company, Chicago, IL (US)

(72) Inventors: Nam Hoang Nguyen, Anaheim, CA (US); Richard Joel Thompson, Huntsville, AL (US); John R. Lowell, Fairfax, VA (US); Marna M. Kagele, Seattle, WA (US); Kristen Smith Williams, Madison, AL (US)

(73) Assignee: The Boeing Company, Chicago, IL (US)

( * ) Notice: Subject to any disclaimer, the term of this patent is extended or adjusted under 35 U.S.C. 154(b) by 508 days.

(21) Appl. No.: 17/653,949

(22) Filed: Mar. 8, 2022

(65) Prior Publication Data
US 2023/0289501 A1    Sep. 14, 2023

(51) Int. Cl.
*G06F 30/32* (2020.01)
*G06F 30/3308* (2020.01)
(Continued)

(52) U.S. Cl.
CPC .............. *G06F 30/32* (2020.01); *G06N 10/20* (2022.01); *G06N 10/40* (2022.01);
(Continued)

(58) Field of Classification Search
CPC .... G06F 30/32; G06F 30/3308; G06F 30/367; G06F 30/398; G06N 10/40; G06N 10/20
(Continued)

(56) References Cited

U.S. PATENT DOCUMENTS

| | | | |
|---|---|---|---|
| 11,144,689 B1* | 10/2021 | Cowtan | G06F 30/327 |
| 2019/0332731 A1* | 10/2019 | Chen | G06F 30/3308 |

(Continued)

FOREIGN PATENT DOCUMENTS

| | | | | |
|---|---|---|---|---|
| CN | 107077641 A | * | 8/2017 | B82Y 10/00 |
| CN | 109800883 A | * | 5/2019 | G06N 10/00 |

(Continued)

OTHER PUBLICATIONS

Jang et al., Chinese Patent Document No. CN-114037082-A, published Feb. 11, 2022, 4 pages including abstract and 1 claim. (Year: 2022).*

(Continued)

*Primary Examiner* — Phallaka Kik
(74) *Attorney, Agent, or Firm* — Yee & Associates, P.C.

(57) ABSTRACT

A method of minimizing a cost function of a quantum computation is provided. The method comprises receiving input of an initial state of a quantum problem instance comprising a Hamiltonian with an associated cost function. The Hamiltonian is converted into a number of Pauli strings, which are used to form an operator pool. The Pauli strings in the operator pool are ranked according to how much they lower a value of the cost function with respect to the initial state. Pauli strings are iteratively added from the operator pool to a parameterized quantum circuit, in a manner to minimize circuit depth, until a variational quantum eigensolver (VQE) algorithm converges to an approximate ground state wave function generated by the parameterized quantum circuit.

27 Claims, 10 Drawing Sheets

(51) Int. Cl.
*G06F 30/367* (2020.01)
*G06F 30/398* (2020.01)
*G06N 10/20* (2022.01)
*G06N 10/40* (2022.01)

(52) U.S. Cl.
CPC ........ *G06F 30/3308* (2020.01); *G06F 30/367* (2020.01); *G06F 30/398* (2020.01)

(58) Field of Classification Search
USPC ................. 716/101, 106, 111, 136; 703/14
See application file for complete search history.

(56) References Cited

U.S. PATENT DOCUMENTS

| | | | | |
|---|---|---|---|---|
| 2021/0350056 A1* | 11/2021 | Chen | ................. | G06F 30/00 |
| 2022/0172098 A1* | 6/2022 | Johri | ................. | G06N 10/20 |
| 2023/0153074 A1* | 5/2023 | Thompson | ............. | G06F 9/455 |
| | | | | 717/104 |
| 2023/0237361 A1* | 7/2023 | Cowtan | .................. | G06N 5/01 |
| | | | | 706/62 |
| 2024/0169248 A1* | 5/2024 | Johri | .................... | H03M 13/13 |

FOREIGN PATENT DOCUMENTS

| | | | | |
|---|---|---|---|---|
| CN | 111291892 A | * | 6/2020 | ............ G06N 10/00 |
| WO | WO-2016040708 A1 | * | 3/2016 | ............ B82Y 10/00 |
| WO | WO-2020151129 A1 | * | 7/2020 | ............ G06N 10/00 |

OTHER PUBLICATIONS

European Patent Office Extended Search Report, dated Jul. 21, 2023, regarding Application No. EP23159587, 12 pages.
Fan et al., "Circuit-Depth Reduction of Unitary-Coupled-Cluster Ansatz by Energy Sorting," Jun. 29, 2021 (Jun. 29, 2021), pp. 1-10, XP093062385, Retrieved from the Internet: URL: https://arxiv.org/pdf/2106.15210v1.pdf [retrieved on Jul. 10, 2023]; abstract; Sections I-IV; Algorithm 1; Appendices A-D; figure 1.
Li et al., "Paulihedral: A Generalized Block-Wise Compiler Optimization Framework for Quantum Simulation Kernels," ARXIV. org, Cornell University Library, 201 Olin Library, Cornell University, Ithaca, NY 14853, Sep. 7, 2021, XP091051480, abstract; Sections 1-7; Algorithms 1-3; figures 1-10.
Tang et al., "qubit-Adapt-VQE: An adaptive algorithm for constructing hardware-efficient ansatze on a quantum processor," ARXIV. org, Cornell University Library, 201 Olin Library Cornell University Ithaca, NY 14853, Nov. 22, 2019, XP081538354, abstract; Sections I and II.
Zhang et al., "Differentiable Quantum Architecture Search," ARXIV. org, Cornell University Library, 201 Olin Library Cornell University Ithaca, NY 14853, Oct. 14, 2021, XP091063033, abstract; Sections 1-5; Appendices A-I; Figures 1, 2, 3.
Zhang et al., "Variational Quantum Eigensolver with Reduced Circuit Complexity," ARXIV. org, Cornell University Library, 201 Olin Library Cornell University Ithaca, NY 14853, Jun. 14, 2021, XP081989544, abstract; Sections I-IV; figures 1, 2.

* cited by examiner

REDUCING RESOURCES IN QUANTUM CIRCUITS

BACKGROUND INFORMATION

1. Field

The present disclosure relates generally to computing system, more specifically, to an automated method for designing optimal program and circuits.

2. Background

Advanced algorithm development can be difficult and time consuming. Particularly in the case of quantum computers, quantum algorithm development may also be counterintuitive due to dependence on quantum-mechanical behavior such as quantum entanglement and superposition. At present, the primary solution to algorithm development is to manually design a program or circuit, which might be performed on a classical simulation tool or directly on hardware, either classical or quantum.

Therefore, it would be desirable to have a method and apparatus that take into account at least some of the issues discussed above, as well as other possible issues.

SUMMARY

An illustrative embodiment provides a computer-implemented method of minimizing a cost function of a quantum computation. The method comprises receiving input of an initial state of a quantum problem instance comprising a Hamiltonian with an associated cost function. The Hamiltonian is converted into a number of Pauli strings, which are used to form an operator pool. The Pauli strings in the operator pool are ranked according to how much they lower a value of the cost function with respect to the initial state. Pauli strings are iteratively added from the operator pool to a parameterized quantum circuit, in a manner to minimize circuit depth, until a variational quantum eigensolver (VQE) algorithm converges to an approximate ground state wave function generated by the parameterized quantum circuit.

Another illustrative embodiment provides a system for minimizing a cost function of a quantum computation. The system comprises a storage device configured to store program instructions and one or more processors operably connected to the storage device and configured to execute the program instructions to cause the system to: receive input of an initial state of a quantum problem instance comprising a Hamiltonian with an associated cost function; convert the Hamiltonian into a number of Pauli strings; form an operator pool from the Pauli strings; rank the Pauli strings in the operator pool according to how much they lower a value of the cost function with respect to the initial state; and iteratively add Pauli strings from the operator pool to a parameterized quantum circuit, in a manner to minimize circuit depth, until a variational quantum eigensolver (VQE) algorithm converges to an approximate ground state wave function generated by the parameterized quantum circuit.

Another illustrative embodiment provides a computer program product for minimizing a cost function of a quantum computation. The computer program product comprises a computer-readable storage medium having program instructions embodied thereon to perform the steps of: receiving input of an initial state of a quantum problem instance comprising a Hamiltonian with an associated cost function; converting the Hamiltonian into a number of Pauli strings; forming an operator pool from the Pauli strings; ranking the Pauli strings in the operator pool according to how much they lower a value of the cost function with respect to the initial state; and iteratively adding Pauli strings from the operator pool to a parameterized quantum circuit, in a manner to minimize circuit depth, until a variational quantum eigensolver (VQE) algorithm converges to an approximate ground state wave function generated by the parameterized quantum circuit.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account one or more different considerations. The illustrative embodiments recognize and take into account that quantum computing potential speedups over classical ways of solving complex problems. Quantum computers are likely to provide enormous computing advantages for specific tasks such as materials modeling, optimization, machine learning, and cryptography.

The illustrative embodiments also recognize and take into account that current quantum processors are noisy with limited quantum resources (limited number of qubit and coherence time). Hence they are usually referred to as Noisy Intermediate-Scale Quantum (NISQ) devices. For this very reason, hybrid quantum-classical algorithms have become the prominent user for current hardware as they require less quantum resource than traditional quantum algorithms. In particular, the class of variational quantum algorithm (VQA), which includes the variational Quantum Eigensolver (VQE) algorithm and the Quantum approximate optimization algorithm (QAOA), is becoming very popular because they allow quantum speedup to difficult problems.

The illustrative embodiments also recognize and take into account that one of the key ingredients to success for these types of algorithms is the construction of the parameterized quantum circuit, also known as the ansatz (trial wave function). The more expressibility the parameterized quantum circuit possesses (i.e., the circuit's ability to generate quantum states) the greater likelihood of finding the correct solution. However, parameterized quantum circuits with arbitrary high expressibility have bad scaling in the number of parameters with respect to the dimension of the problem, making it undesirable and difficult to optimize over the VQA cost function landscape. Moreover, such parameterized quantum circuits often lead to a suboptimal solution simply because of the increase in the complexity of the search space.

The illustrative embodiments also recognize and take into account that there is no general rule of how to construct a parameterized quantum circuit with high enough expressibility to achieve an answer with high precision but also low in quantum resources.

Figure 1:
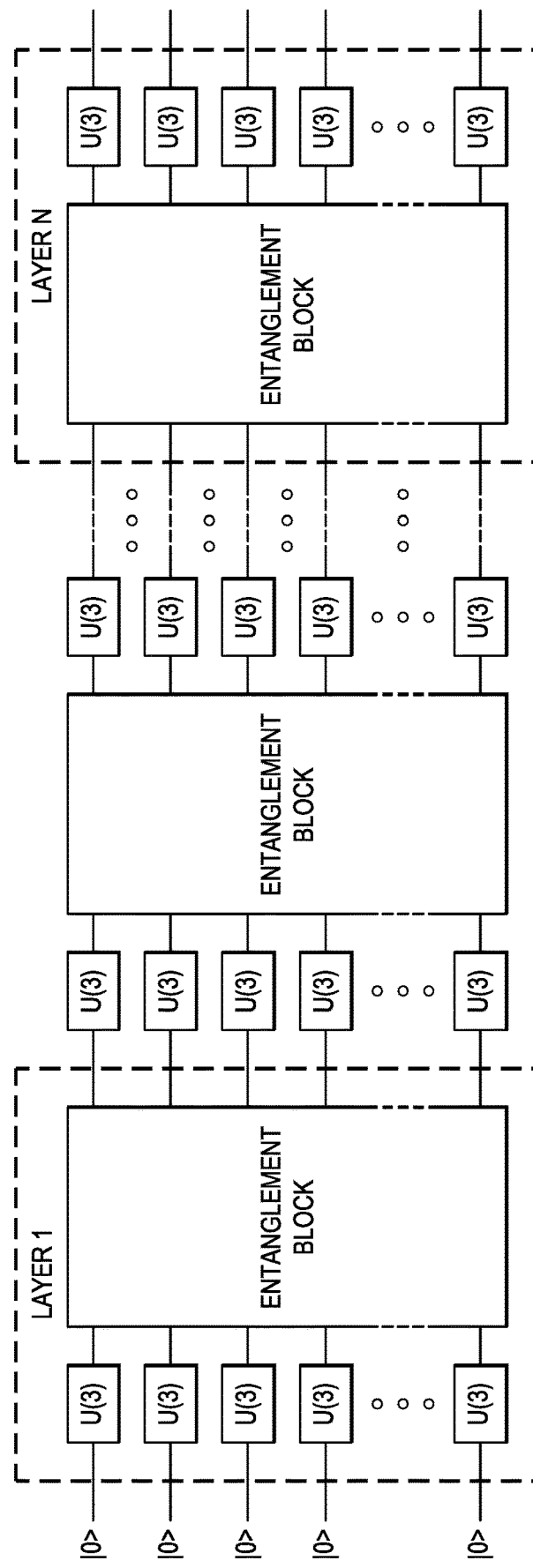
FIG. 1 depicts a hardware efficient parameterized quantum circuit designed through trial and error in accordance with the prior art.

FIG. 1 depicts a hardware efficient parameterized quantum circuit designed through trial and error in accordance with the prior art. Currently, giving the problem of interest, the parameterized quantum circuit is designed as multi-layered parameterized quantum circuits, in which layers of a circuit template are repeated with the goal of increasing the expressibility of the circuit. The number of repeated layers is chosen by trial and error. In the present example, the popular hardware efficient parameterized quantum circuit has the general form as shown in FIG. 1. This type of parameterized quantum circuit design can lead to a very long quantum circuit before it is expressible enough to represent the ground state wave function due to its fixed underlying structure.

The molecular electronic eigenvalue problem, which is about finding the electronic ground state energy of a molecular system under Born-Oppenheimer approximation, by itself, is a problem of great interest due to its ability to accurately model real molecules from first principles. However, because of the exponential scaling of the problem, it is impossible to find an exact solution of systems with more than a few dozen electrons on a classical computer. There are several approximation techniques that have been introduced to access large-scale systems with more than 1000 electrons on high-performance computers. However, these techniques do not provide solutions with chemical accuracy. Therefore, it is an infeasible task to deal with molecular structures with a few thousand electrons, even with the world's best supercomputer. Near-term quantum computers can potentially solve this problem efficiently using VQE. However, VQE is a heuristic algorithm, and its success depends heavily on the design of the parameterized quantum circuit.

The illustrative embodiments provide a method to determine a parameterized quantum circuit with just high enough expressibility with respect to the problem of interest while keeping the quantum resources as low as possible. The illustrative embodiments provide the ability to create a compact parameterized quantum circuit with low enough quantum resources to fit within NISQ devices while still achieving high precision results.

The illustrative embodiments apply to variational quantum algorithms such as the variational quantum eigensolver (VQE) algorithm. This approach enables reduction of quantum resources in a quantum circuit in comparison to increasing circuit expressibility by repeatedly adding the same circuit structure over and over again, as for example in the hardware efficient parameterized quantum circuit shown in FIG. 1.

Figure 2:
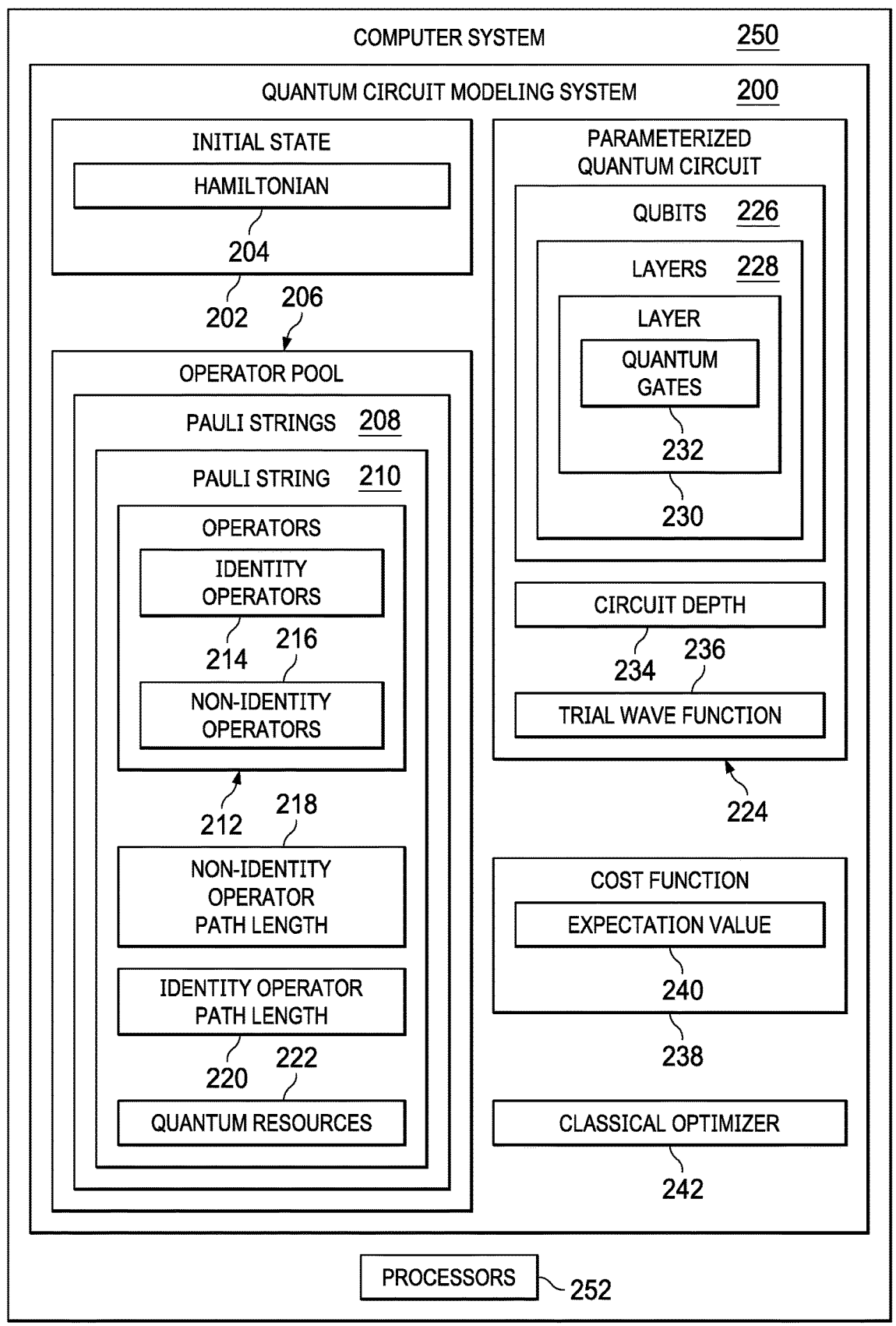
FIG. 2 depicts a block diagram illustrating a quantum circuit modeling system in accordance with an illustrative embodiment.

Turning now to FIG. 2, an illustration of a block diagram of a quantum circuit modeling system is depicted in accordance with an illustrative embodiment. Quantum circuit modeling system 200 generates and fine tunes parameterized quantum circuit 224 in order generate the ground state wave function to a chemical system. Quantum circuit modeling system 200 progressively fine tunes parameterized quantum circuit 224 until it generates a wave function with the lowest energy (ground state wave function).

Quantum circuit modeling system 200 begins by defining a mean-field initial state 202, i.e., Hartree-Fock state, of the chemical system in question, which is characterized by Hamiltonian 204.

Hamiltonian 204 can be decomposed into a number of Pauli strings 208. Each Pauli string 210 comprises a sequence of operators 212 that are made from Pauli matrices and the 2×2 Identity matrix, which defines a basis for the Hamiltonian 204. Operators 212 may be divided into identity operators 214 and non-identity operators 216. The sequence of operators 212 can be characterized by a non-identity operator path length 218 and an identity operator path length 220. The non-identity operator path length 218 is the length of the Pauli string 210 (total number of operators) minus any exterior identity operators. For example, Pauli string YXZIYZIIZ has a non-identity operator path length of eight (the whole string), whereas Pauli string YXZXXXIII has a non-identity operator path length of five (see also FIG. 4). This number may comprise only a subset of the total number of operators 212 in the Pauli string 210 or the full number of operators 212 depending on the position of the identity operators 214 within the Pauli string. The shorter the non-identity operator path length 218, the less quantum resources 222 associated with implementing the Pauli string 210 in parameterized quantum circuit 224. The identity operator path length 220 is defined by the number of exterior identity operators 214 within the Pauli string 210.

Parameterized quantum circuit 224 may comprise a number of layers 228 building from the exponentiation of Pauli strings. Each layer 230 has a corresponding Pauli string 210 which is selected based on its contribution to energy lowering (reducing the cost function value) as well as its structure, i.e., the identity and non-identity path length. Each layer 230 can be thought of as a sub-circuit in the form of quantum gates 232 applied to qubits 226 within the parameterized quantum circuit 224 according to the non-identity operators within a Pauli string. Circuit depth 234 is determined by the number of quantum gates 232 used in the longest path of the parameterized quantum circuit 224, which determines the required coherence time, a quantum resource, for the parameterized quantum circuit 224. For example, a quantum circuit using 10 qubits and having a depth of 20 consumes more quantum resources than a 10-quubit quantum circuit with a depth of five.

Parameterized quantum circuit 224 generates a trial wavefunction 236, which is used to calculate an expectation value (energy) 240 for a cost function 238 associated with Hamiltonian 204 of the chemical system. The cost function 238 defines the energy landscape with respect to a particular parameterized quantum circuit, usually represented as:

$$C(\theta) = \langle \psi(\theta)|H|\psi(\theta) \rangle$$

where $\theta$ represents the parameter vector that defines the parameterized quantum circuit 224, i.e., $\theta = \{\theta_1, \theta_2, \ldots, \theta_n\}$.

Many parameterized quantum circuits require a long circuit depth before they are able to generate the correct solution (wave function) sought. The illustrative embodiments allow for the design of a parameterized quantum circuit 224 that minimizes the circuit depth 234 while still generating the correct solution.

Classical optimizer 242 is used as part of the VQE algorithm to optimize the parameters in the parameterized quantum circuit 224 so that the cost function is minimize and to determine whether or not to continue adding more Pauli strings (layers) 228 to the parameterized quantum circuit 224. Only those Pauli strings that contribute to lowering the cost function 238 are added to parameterized quantum circuit 224. For example, the current parameterized quantum circuit may be in the form:

$$U(\theta) = e^{i\theta_1 P_1} e^{i\theta_2 P_2} \ldots e^{i\theta_{10} P_{10}}$$

meaning it is formed by 10 Pauli strings $P_1, P_2, \ldots, P_{10}$. The VQE algorithm may produce an energy of, e.g., −5. This value is compared to the VQE result with just 8 and 9 Pauli strings. If the energy values are essentially the same, no more Pauli strings (layers) would be added to the parameterized circuit 224. However, if the energy is lower (over a predefined threshold) with 10 Pauli strings than with 9 Pauli strings, then another Pauli string would be added.

Quantum circuit modeling system 200 can be implemented in software, hardware, firmware, or a combination thereof. When software is used, the operations performed by quantum circuit modeling system 200 can be implemented in program code configured to run on hardware, such as a processor unit. When firmware is used, the operations performed by Quantum circuit modeling system 200 can be implemented in program code and data and stored in persistent memory to run on a processor unit. When hardware is employed, the hardware may include circuits that operate to perform the operations in quantum circuit modeling system 200.

In the illustrative examples, the hardware may take a form selected from at least one of a circuit system, an integrated circuit, an application specific integrated circuit (ASIC), a programmable logic device, or some other suitable type of hardware configured to perform a number of operations. With a programmable logic device, the device can be configured to perform the number of operations. The device can be reconfigured at a later time or can be permanently configured to perform the number of operations. Programmable logic devices include, for example, a programmable logic array, a programmable array logic, a field programmable logic array, a field programmable gate array, and other suitable hardware devices. Additionally, the processes can be implemented in organic components integrated with inorganic components and can be comprised entirely of organic components excluding a human being. For example, the processes can be implemented as circuits in organic semiconductors.

These components for quantum circuit modeling system 200 can be located in computer system 250, which is a physical hardware system and includes one or more data processing systems. When more than one data processing system is present in computer system 250, those data processing systems are in communication with each other using a communications medium. The communications medium can be a network. The data processing systems can be selected from at least one of a computer, a server computer, a tablet computer, or some other suitable data processing system.

For example, quantum circuit modeling system 200 can run on one or more processors 252 in computer system 250. As used herein a processor is a hardware device and is comprised of hardware circuits such as those on an integrated circuit that respond and process instructions and program code that operate a computer. When processors 252 execute instructions for a process, one or more processors can be on the same computer or on different computers in computer system 250. In other words, the process can be distributed between processors 252 on the same or different computers in computer system 250. Further, one or more processors 252 can be of the same type or different type of processors 252. For example, one or more processors 252 can be selected from at least one of a single core processor, a dual-core processor, a multi-processor core, a general-purpose central processing unit (CPU), a graphics processing unit (GPU), a quantum processing unit (QPU), a digital signal processor (DSP), or some other type of processor.

Figure 3:
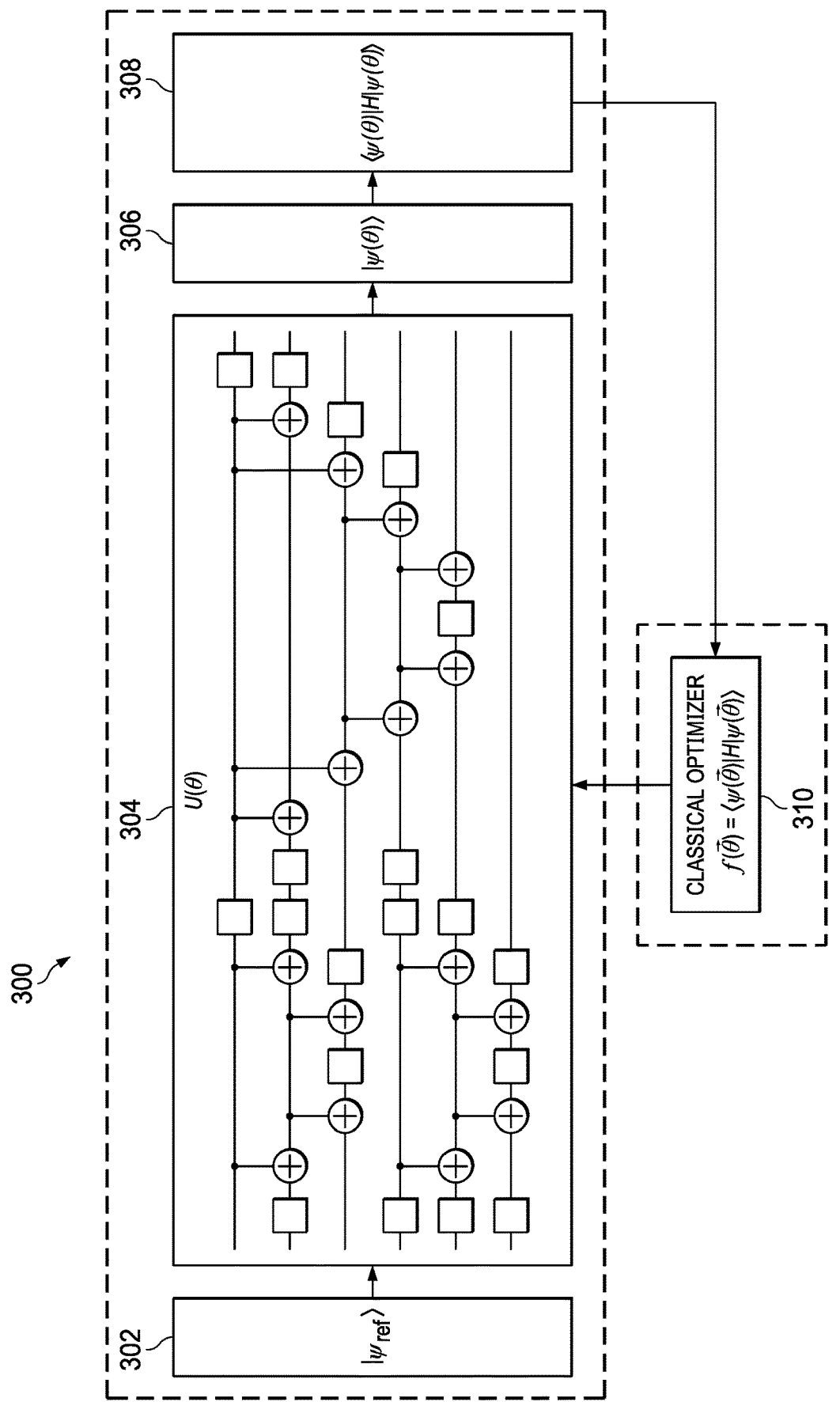
FIG. 3 depicts a variational quantum eigensolver process flow in accordance with an illustrative embodiment.

FIG. 3 depicts a variational quantum eigensolver (VQE) process flow in accordance with an illustrative embodiment. Search algorithm 300 can be implemented in quantum circuit modeling system 200 in FIG. 2.

Search algorithm 300 comprises three steps: 1) preparing an initial state 302, 2) calculating the expectation value 308 for the Hamiltonian with a parameterized quantum circuit 304 that generates a trial wavefunction 306, and 3) utilizing a classical optimizer 310 to minimize the cost function $\langle \psi(\theta)|H|\psi(\theta) \rangle$ via updating the parameterized quantum circuit parameters $\theta$ in the quantum circuit. H describe the molecular electronic Hamiltonian within the Born-Oppenheimer approximation, which allows H to be written in the form of second quantization as:

$$H_{2nd\ quant} = \sum_{pq} h_{pq} a_p^\dagger a_q + \sum_{pqrs} h_{pqrs} a_p^\dagger a_q^\dagger a_r a_s$$

which then can be mapped onto qubit operators using some type of transformations, like Jordan-Wigner or Bravyi-Kitaev, to arrive at the form:

$$H = \sum_{i\alpha} h_\alpha^i \sigma_\alpha^i + \sum_{ij\alpha\beta} h_{\alpha\beta}^{ij} \sigma_\alpha^i \sigma_\beta^j + \sum_{ijk\alpha\beta\gamma} h_{\alpha\beta\gamma}^{ijk} \sigma_\alpha^i \sigma_\beta^j \sigma_\gamma^k + \ldots$$

Using the linearity property of Trace produces:

$$\langle \psi(\theta)|H|\psi(\theta) \rangle =$$
$$\langle H \rangle = \sum_{i\alpha} h_\alpha^i \langle \sigma_\alpha^i \rangle + \sum_{ij\alpha\beta} h_{\alpha\beta}^{ij} \langle \sigma_\alpha^i \sigma_\beta^j \rangle + \sum_{ijk\alpha\beta\gamma} h_{\alpha\beta\gamma}^{ijk} \langle \sigma_\alpha^i \sigma_\beta^j \sigma_\gamma^k \rangle + \ldots$$

which allows calculation of ⟨H⟩ on a current and near-term quantum computer. Furthermore, the terms in H only grow in the scale of $O(N^4)$.

One of the advantages of executing variational type calculations on a quantum computer is the efficiency of generating hard trial wave functions on the quantum computer. There are states that can be prepared very efficiently on quantum computers but not on classical computers.

A key element of search algorithm 300 is designing a parameterized quantum circuit 304 that can efficiently generate a trial wavefunction 306 that is close to the ground state wavefunction, which allows a good approximation to the ground state energy.

Search algorithm 300 decomposes the molecular Hamiltonian into Pauli strings which are N-fold tensor products of Pauli matrices along with a 2×2 identity matrix. The number of Pauli strings will scale as $O(N^4)$:

$$H = \sum_{i\alpha} h_\alpha^i \sigma_\alpha^i + \sum_{ij\alpha\beta} h_{\alpha\beta}^{ij}\sigma_\alpha^i\sigma_\beta^j + \sum_{ijk\alpha\beta\gamma} h_{\alpha\beta\gamma}^{ijk}\sigma_\alpha^i\sigma_\beta^j\sigma_\gamma^k + \ldots = \sum p_i P_i$$

The set containing all the relevant Pauli strings $P_i$ that will be used by this embodiment to construct an efficient parameterized quantum circuit will be denoted as S. It should be noted that S is constructed based on the Pauli strings in the Hamiltonian, H. However, the elements of S are not the same as the elements of H. The Pauli strings in S form an operator pool which are used to build the adaptive parameterized quantum circuit of the form:

$$U = \prod_{i=depth} e^{-\gamma_i B} e^{-i\beta_i P_i}$$

wherein B can be taken to be $B=\Sigma_j \otimes X_j$ or $\Sigma_j \otimes Y_j$ or $\Sigma_j \otimes I_j$, which is equivalent to just a layer of single qubit rotational gates $R_X(\gamma_j)$, $R_Y(\gamma_j)$ or identity gates, respectively. It can take the form of some other single qubit rotations as well as a mixture of different single qubit rotations, e.g., a mixture of $R_Y$ and $R_X$ rotations. Ideally, it is desirable for B and Pi to not commute, as commuting operators share a common eigenvector.

After the set, S, of Pauli strings is determined, the illustrative embodiments construct the parameterized quantum circuit, U, layer by layer until convergence is reached, meaning there is no further reduction in energy, i.e., the cost function has reached its minimum value. Once a Pauli string is added to the parameterized quantum circuit, that string is removed from set, S, so is it no longer in the pool of operators available to add to the parameterized quantum circuit in future iterations.

Building the first layer of the parameterized quantum circuit comprises finding a $P_k \in S$ such that:

$$_{ref}\langle\psi|e^{i\gamma_k B}e^{i\beta_k P_k}He^{-i\gamma_k B}e^{-i\beta_k P_i}|\psi\rangle_{ref} \leq$$
$$_{ref}\langle\psi|e^{i\gamma_k B}e^{i\beta_k P_i}He^{-i\gamma_k H}e^{-i\beta_k P_k}|\psi\rangle_{ref}$$
$$\forall P_i \in S$$

The search for this $P_k$ is efficient. If VQE is chosen as an algorithm to determine $P_k$ then ISI executions of VQE would be needed, which in the worst-case scales as $O(N^4)$. In general, it would be much less. It should be noted that the entire algorithm, from start to finish, will also scale as $O(poly(N))$. There might exist multiple Pi such that:

$$|_{ref}\langle\psi|e^{i\gamma_k B}e^{i\beta_k P_k}He^{-i\gamma_k H}e^{-i\beta_k P_k}|\psi\rangle_{ref} -$$
$$_{ref}\langle\psi|e^{i\gamma_k H}e^{i\beta_k P_k}He^{-i\gamma_k B}e^{-i\beta_k P_i}|\psi\rangle_{ref}| \leq e$$

Where $\epsilon \in \mathbb{R}$ is any arbitrary value but should be taken to be the chemical precision threshold ($10^{-3}$ Hartree) or smaller. Such $P_i$ belongs in a set that denoted as M. Within M, we can determine its best element, $P_{optimal}^1$, based on the arrangement of the Pauli operators. This selection is based on the quantum resource needed to generate the circuit $U_i = e^{-i\beta P_i}$. One of the criteria for choosing $P_i$ is the number of identity operators it contains. This criterion can be demonstrated with a simple example with P=IX, in which $$e^{i\beta IX} = \cos(\beta)IX + \sin(\beta)IX = I(\cos(\beta)X + \sin(\beta)X)$$

which is a circuit that involves only a single qubit. Therefore, the more identity operators, the better.

However, most current quantum processors do not have all-to-all qubit connections, but rather only neighboring qubit connection. Therefore, having more identity operators does not necessarily correspond to a less quantum resource, but rather having a certain arrangement of identity operators will reduce the circuit depth.

Figure 4:
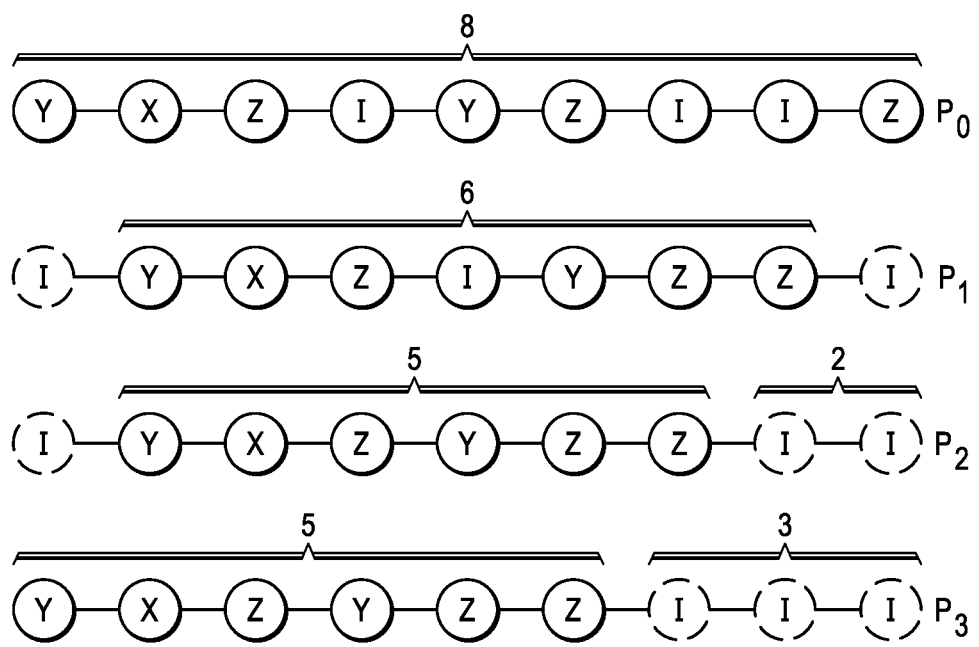
FIG. 4 depicts four example Pauli strings that can be used to construct a quantum circuit in accordance with an illustrative embodiment.

FIG. 4 depicts four example Pauli strings that can be used to construct a quantum circuit in accordance with an illustrative embodiment. The Pauli strings can be thought of as sub-circuits that search algorithm 300 can use as building blocks to build a parameterized quantum circuit 304.

In this example, each Pauli string, $P_0$, $P_1$, $P_2$, $P_3$ includes three identity operators, I, but their corresponding circuits have different levels of complexity due to the respective sequences of their operators, specifically the positions of the identity operators.

In the present example, $P_0$ has the highest cost and complexity to implement, $P_1$ has the second highest cost, followed by $P_2$, and then $P_3$. The cost/complexity of a Pauli string and its associated quantum circuit is determined by the path length, which is defined by the length of the Pauli string minus any exterior identity operators. This definition is used because even though an identity operator, I, indicates that the particular qubit at that position will not be used, it still creates a gap between the neighboring Pauli. Given that current and near-term quantum computers will predominantly only have neighboring qubit layouts, interior identity operators are not as helpful in term of quantum resource reduction since additional quantum operations have to be performed so the qubits on both sides of the interior identity operators can talk to each other. The VQE search algorithm 300 of the illustrative embodiments seeks to minimize such empty spaces between quantum gates when building the parameterized quantum circuit layer by layer.

As shown in FIG. 4, $P_0$ has a path length of eight because there are no exterior identity operators. In other words, the non-identity operator path takes up the full length of the Pauli string. In the case of $P_1$, there are two exterior identity operators, one on the left and one on the right, giving $P_1$ a non-identity operator path length of six. By the same token, both $P_2$ and $P_3$ have non-identity operator path length of five. However, the alignment of the exterior identity operators is different for $P_2$ and $P_3$. More specifically, $P_2$ has one left exterior identity operator and two right exterior identity operators, whereas $P_3$ has all three identity operators to the right. Pauli strings with the same number of exterior identity operators belong to an equivalence class.

Pauli strings within the same equivalence class can further be differentiated according to the lengths of the exterior identity operator paths (how many identity operators are on either side of the non-identity operators). There are only two possible paths, left and right. Therefore, search algorithm 300 is looking for:

$$P_k \in S^{optimal}$$

such that $$\max(L, R) \geq \max(L_i, R_i)$$

where L, R correspond to the left and right exterior identity path length of $P_k$, respectively, and $L_i$, $R_i$ correspond to the left and right exterior identity path length of the other Pauli string $P_i$ in the class $S^{optimal}$.

Therefore, in the example in FIG. 4, $P_3$ has a max right exterior identity operator path length of three, whereas $P_2$ has a max right exterior identity operator path length of two. Therefore, $P_3$ is prioritized or has a higher rank than $P_2$ even though they both belong to the same equivalence class.

The justification for this process is that even though the circuit construction for all $P_i \in S^{optimal}$ have the same complexity, some offer better flexibility at the next stage/layer of the parameterized quantum circuit compared to others. A longer identity chain offers more flexibility at the next step to select a Pauli string that can be run in parallel with the current Pauli string, thereby providing a way to possibly perform two layers (executing two Pauli strings from the operator pool) with half the coherence time as it would have originally.

Therefore, search algorithm 300 builds the parameterized quantum circuit 304 starting with the Pauli string that has the longest exterior identity path from the largest energy-lowering equivalence class within the set of all equivalence classes of the operator pool, S. For the next layer, the algorithm will extend the VQE parameterized quantum circuit by selecting the Pauli string that has the largest overlap between the non-identity operators with identity operators from the previous Pauli string. The selection scheme will go through the equivalence classes in order, with the largest energy-lowering class first. If more than one Pauli string has been found the algorithm will select the one with the longest exterior identity operator path length. The selection of the Pauli string with longest exterior identity operator is critical in the reduction of the overall circuit depth. The process is repeated until convergence is reached or a pre-defined maximum number of layers is reached.

Figure 5A:
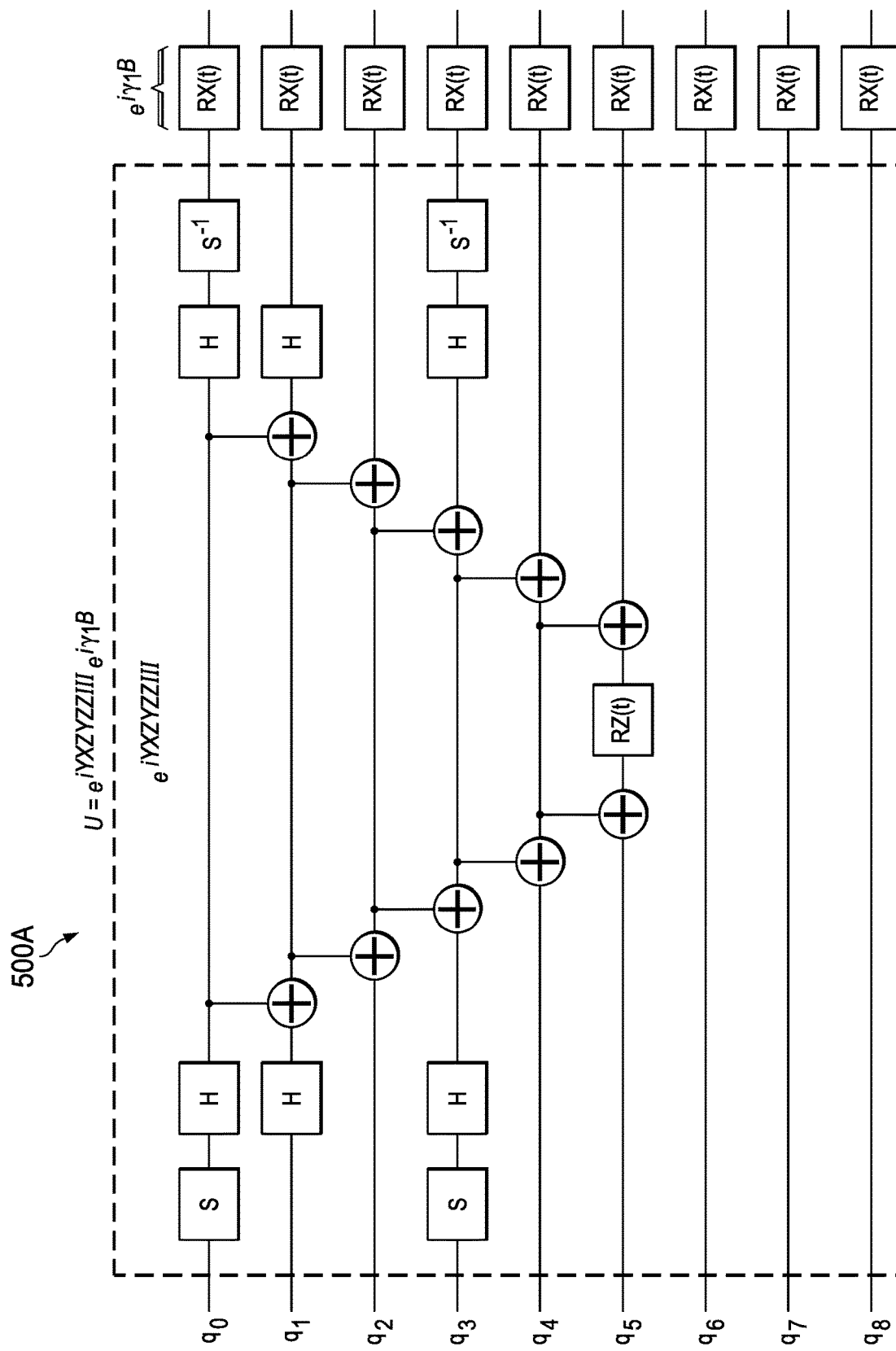
FIG. 5A depicts an example quantum circuit diagram illustrating a first layer of a parameterized quantum circuit in accordance with an illustrative embodiment.
Figure 5B:
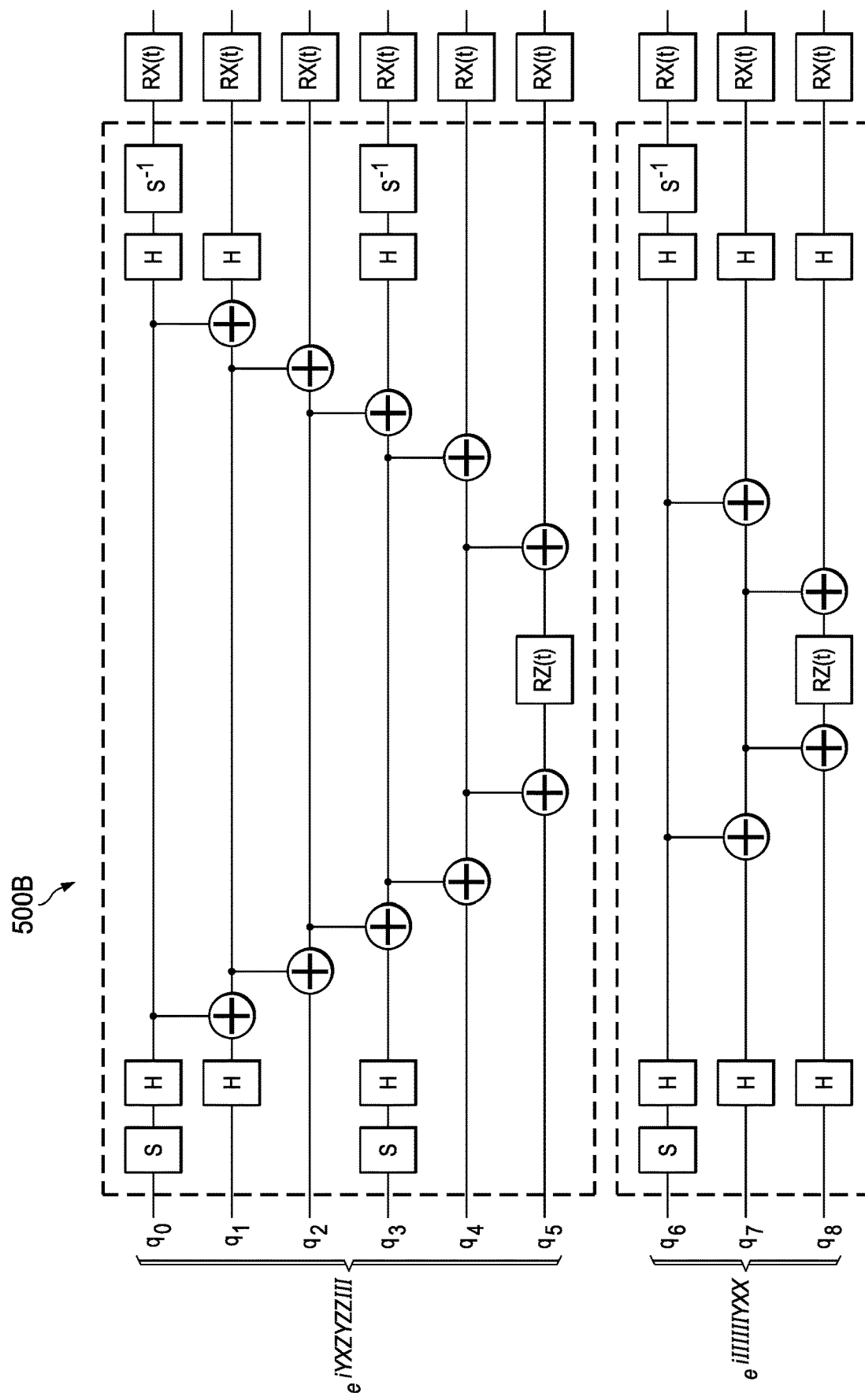
FIG. 5B depicts the addition of a second layer to the parameterized quantum circuit in FIG. 5A in accordance with an illustrative embodiment.

FIG. 5A depicts an example quantum circuit diagram illustrating a first layer of a parameterized quantum circuit in accordance with an illustrative embodiment. FIG. 5B depicts the addition of a second layer to the parameterized quantum circuit in FIG. 5A in accordance with an illustrative embodiment.

In the example shown in FIG. 5A, the first layer is built with Pauli string $P_3$=YXZYZZIII in FIG. 4. In the corresponding quantum circuit 500A, the left most operator in the Pauli string corresponds to the first qubit, $q_0$, and the right most operator corresponds to the ninth qubit, $q_8$. Therefore, because of the three exterior identity operators in the last three positions of $P_3$, qubits $q_6$, $q_7$, and $q_8$ have no quantum gates.

The goal in building the second layer is to try to improve the result of the first layer with as little required additional coherence time as possible while extending the parameterized quantum circuit in the energy-minimum direction. This goal can be accomplished if the circuits of layer 1 and layer 2 can be performed in parallel or almost parallel.

In the present example, the Pauli string $P_3$ used for the first layer has non-identity operators in the first six positions of the string. Therefore, for the second layer, the goal is to find Pauli strings with identity operators in the first six positions of the string if possible. If not, the next largest possible overlap is used. These Pauli strings are saved into a temporary set, $S^{temp}$, where the search algorithm will determine the best one based on the optimal exterior identity operator path along with their energy-lowering order based on the order of the equivalence class they belong to in the initial ranking. In the present example, the best Pauli string may be in a form such as P=IIIIIIYXX, which when added as the second layer of the parameterized quantum circuit adds quantum gates to qubits $q_6$-$q_8$ (which were left open by the first layer), thereby producing quantum circuit 500B shown in FIG. 5B.

Quantum circuit 500B contains two layers but requires no additional time to execute compared to quantum circuit 500A, which contains only the first layer. The driving Hamiltonian only needs to be applied once since $$U_3(\theta_1, \emptyset_1, \text{gamma}_1) * U_3(\theta_2, \emptyset_2, \text{gamma}_2) = U_3(\theta, \emptyset, \text{gamma})$$

As such, it is preferrable to pick a Pauli string with a high exterior identity operator path length in the previous layer if one is available. If the exterior identity operator path length is minimal (i.e., one or less), this step can be skipped or use can be made of the highest interior identity operator path to fit in another layer.

Figure 6:
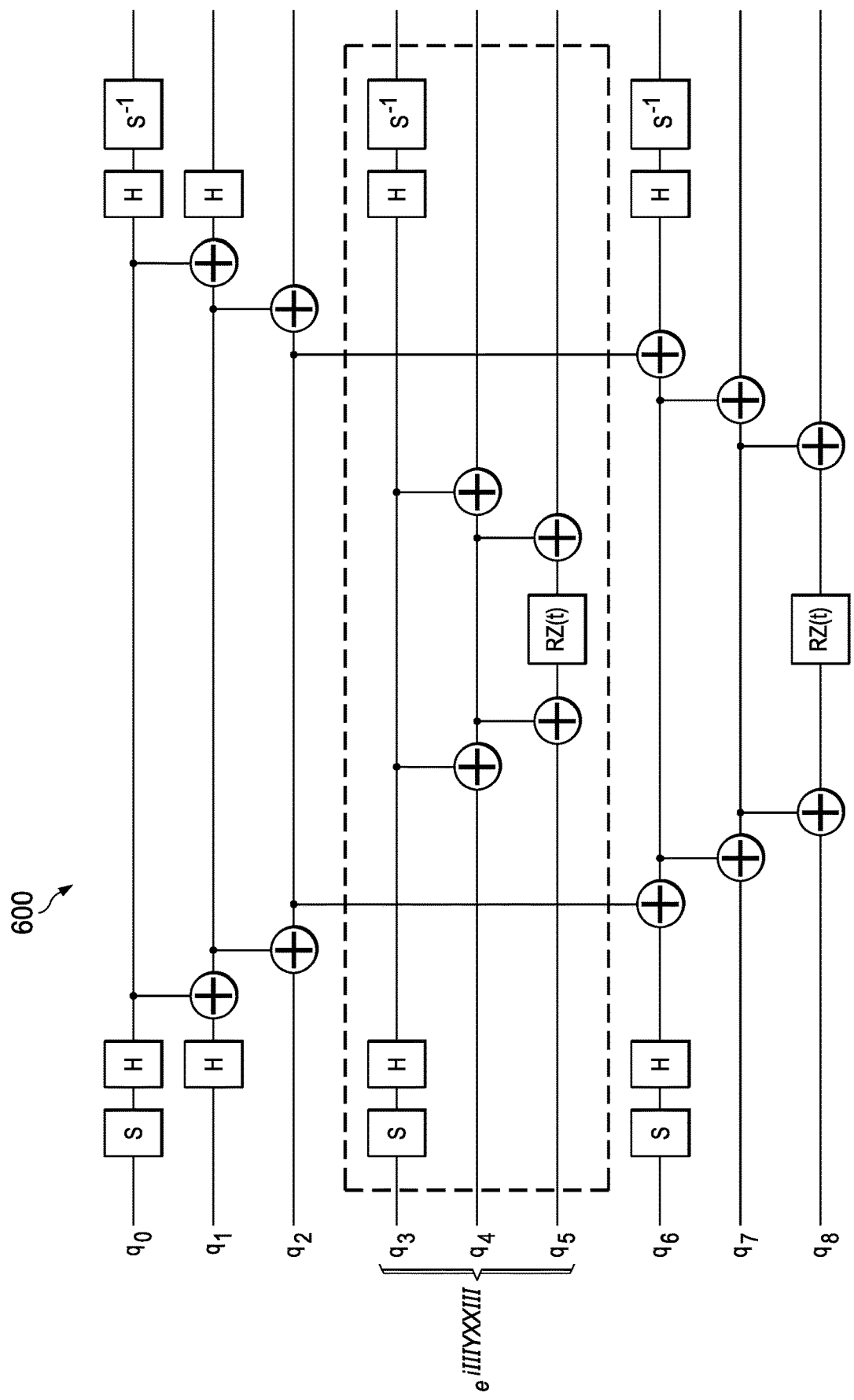
FIG. 6 depicts another example quantum circuit diagram illustrating the first two layers of a parameterized quantum circuit in accordance with an illustrative embodiment.

FIG. 6 depicts another example quantum circuit diagram illustrating the first two layers of a parameterized quantum circuit in accordance with an illustrative embodiment. FIG. 6 illustrates an example of using interior identity operator path length to optimize a parameterized quantum circuit.

In the present example, the first layer of quantum circuit 600 is based on the Pauli string $P_1$=YXZIIIYZZ. The Pauli string selected for the second layer is selected to take advantage of the space left by the interior identity operators of the first layer. In the present example, the second layer is based on the Pauli string $P_2$=IIIYXXIII. Therefore, quantum gates based on the non-identity operators in the middle of $P_2$ are able to occupy qubits $q_3$-$q_5$ left open by the first layer, as shown in quantum circuit 600.

Figure 7:
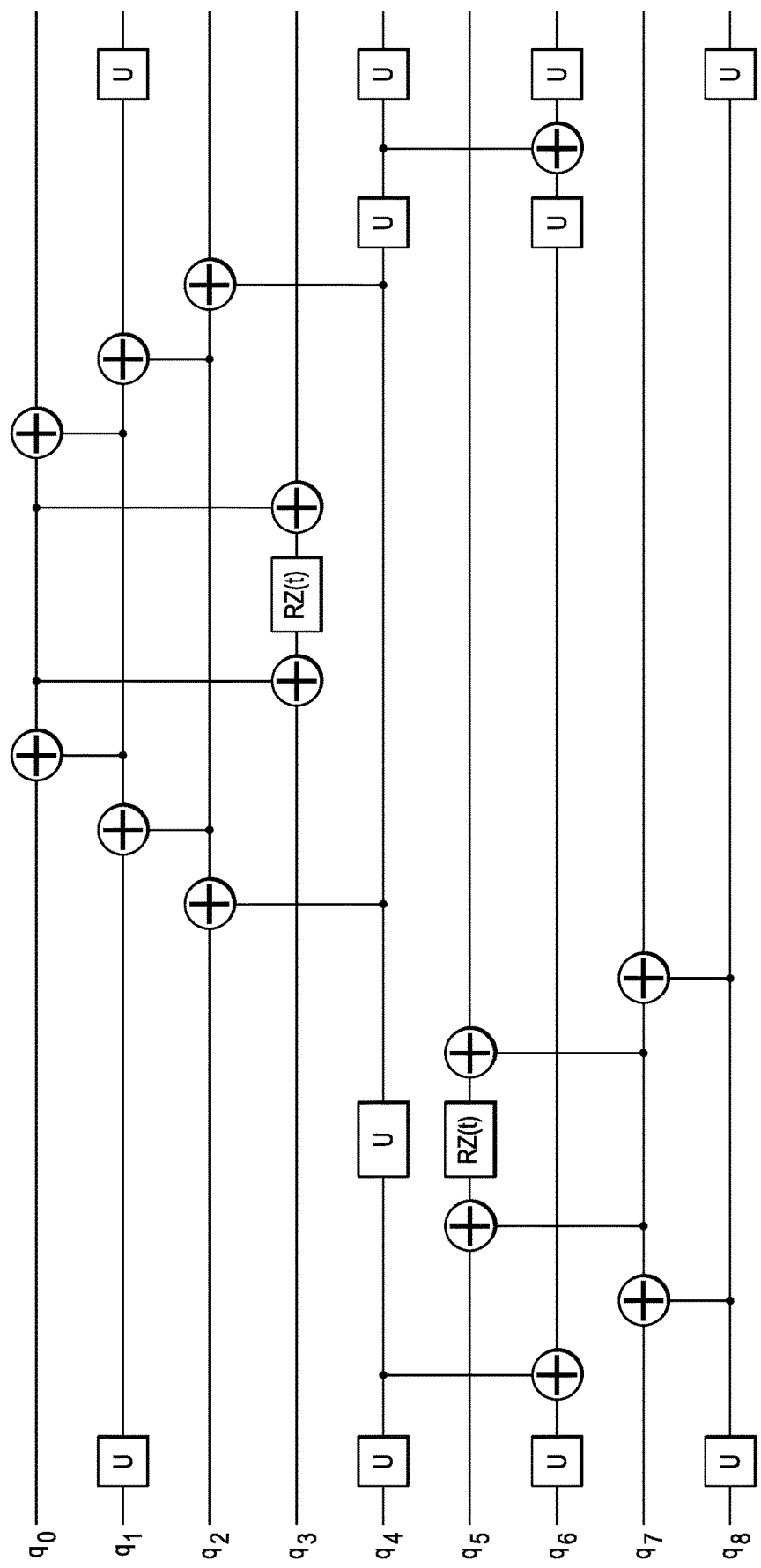
FIG. 7 depicts a quantum circuit diagram illustrating a transpiled circuit based on the quantum circuit in FIG. 6 in accordance with an illustrative embodiment.

In quantum circuit 600 the entanglement gate between $q_2$ and $q_6$ is a long-range two-qubit interaction, which typically would require a significant amount of swapping overhead. However, because quantum circuit 600 comprises a series of CNOT gates in between $q_2$ and $q_6$, many terms can be combined to create a shorter circuit as shown in FIG. 7, which depicts a transpiled quantum circuit based on quantum circuit 600.

After the parameterized quantum circuit has been extended by adding the second layer using the optimal Pauli string, the iterative layers will be added using the same logic as the first and second layer as discussed. The process continues until convergence is reached, meaning no further reduction in energy, or until a predefined maximum number of circuit layers is reached.

In order to reduce and improve the ranking of the operators within the operator pool, which consequently will improve the VQE result along with minimizing the execution time, certain chemical properties can be used during the initial ranking to filter out certain Pauli strings or to lower its priority during the parameterized quantum circuit expansion construction process. In particular, total angular momentum or spin can be used because the ground state wave function, the state to be generated with the parameterized quantum circuit, has certain desired chemical properties such as zero total angular momentum and spin.

When searching and building the parameterized quantum circuit to represent the approximate ground state wave function, the parameterized quantum circuit should conserve certain properties like total angular momentum, spin, and total angular momentum. These properties are computed efficiently as expectation values of suitable qubit operators. The conservation of these properties is crucial when the energy gap between the ground state and the first few excited states is small since in such cases VQE will easily converge into a sub-optimal solution. However, additional constraint can prevent this from happening. Such constraint may be classified as a "soft constraint" or "hard constraint."

Soft constraint refers to selecting the optimal Pauli strings corresponding to their energy output in addition to their total angular momentum output. Thus, a Pauli string that can generate a low energy is not necessarily the best since it could have high total angular momentum.

For example, a hard constraint can be implemented as adding the total angular momentum operator into the cost function as a penalty term. In this case, $$C(\theta) = \langle \psi(\theta)|H|\psi(\theta)\rangle$$

becomes $$C(\theta) = \langle \psi(\theta)|H + \alpha S^2|\psi(\theta)\rangle \quad \alpha \in \mathbb{R}$$

A large value for $\alpha$ will ensure the conservation of total angular momentum in the parameterized quantum circuit wave function.

Figure 8:
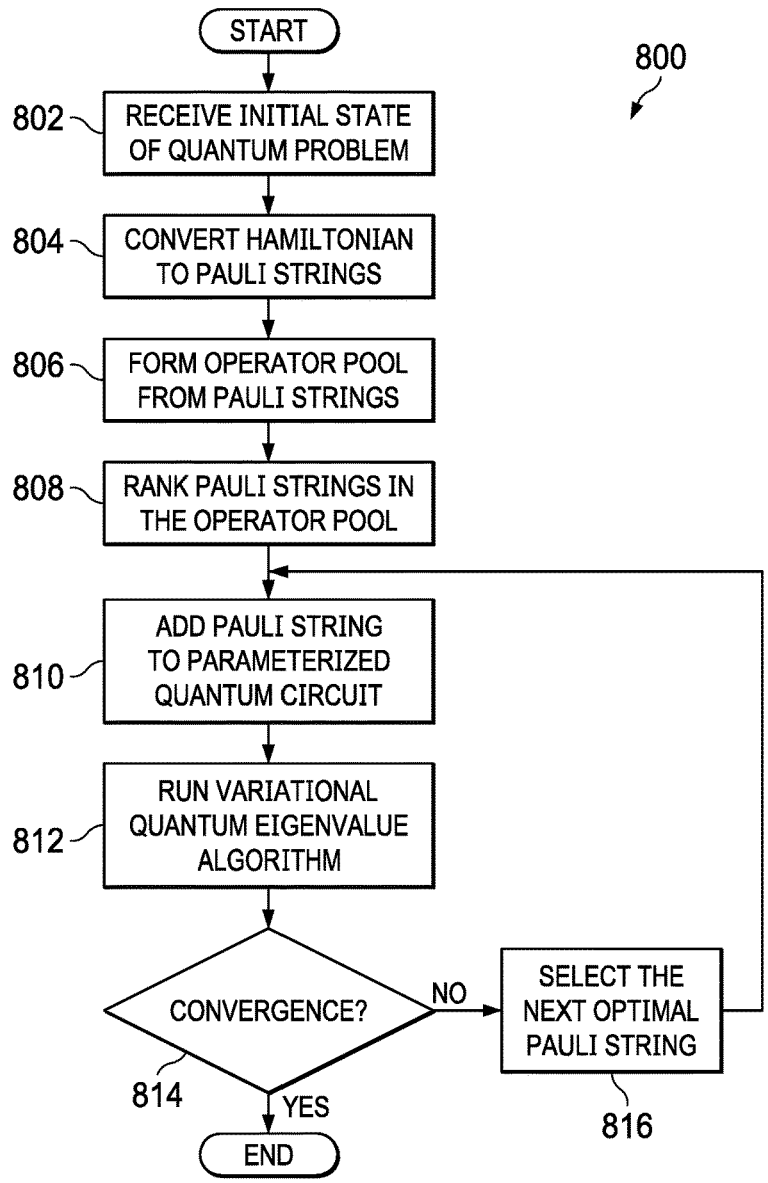
FIG. 8 depicts a flow diagram illustrating a process of minimizing a cost function of a quantum computation in accordance with an illustrative embodiment.

FIG. 8 depicts a flow diagram illustrating a process of minimizing a cost function of a quantum computation in accordance with an illustrative embodiment. Process flow 800 may be implemented in quantum circuit modeling system 200 shown in FIG. 2.

Process 800 begins by receiving input of an initial state of a quantum problem instance comprising a Hamiltonian with an associated cost function (operation 802).

Process 800 converts the Hamiltonian into a number of Pauli strings (operation 804) and forms an operator pool from the Pauli strings (operation 806).

The Pauli strings in the operator pool are ranked according to how much they lower a value of cost function with respect to the initial state, e.g., a mean-field state like Hartree-Fock state (operation 808). The Pauli strings in the operator pool may be further ranked according to non-identity operator path length. Pauli strings with the same non-identity operator path length may be grouped within a same equivalence class. Pauli strings within the same equivalence class may be further ranked according to maximum exterior identity path length.

Process 800 iteratively adds Pauli strings from the operator pool to a parameterized quantum circuit, in a manner to minimize circuit depth, until a VQE algorithm converges to an approximate ground state wave function generated by the parameterized quantum circuit (signifying ground state energy). Quantum gates in the parameterized quantum circuit correspond to non-identity operators in the Pauli strings. The iteration comprises adding a Pauli string from the operator pool to the parameterized quantum circuit according to rank (operation 810). After a Pauli string from the operator pool is added to the parameterized quantum circuit it is discarded from the operator pool and not used again in future iterations.

The VQE algorithm is then run (operation 812) to determine if it has reached convergence (operation 814). Responsive to a determination that the VQE algorithm has not reached convergence, process 800 selected another Pauli string from the operator pool to add to the parameterized quantum circuit (operation 816). The new Pauli string added to the parameterized quantum circuit from the operator pool is selected to maximize overlap of identity operators in the new Pauli string with non-identity operators in the last added Pauli string and maximize overlap of non-identity operators in the new Pauli string with identity operators in the last added Pauli string.

Operations 810 through 816 are repeated iteratively until the VQE algorithm reaches convergence or no Pauli strings remain in the operator pool. When the quantum circuit reaches convergence the iteration of steps 810-816 stops. The VQE algorithm output corresponding to convergence is taken as ground state energy. Process 800 then ends.

Figure 9:
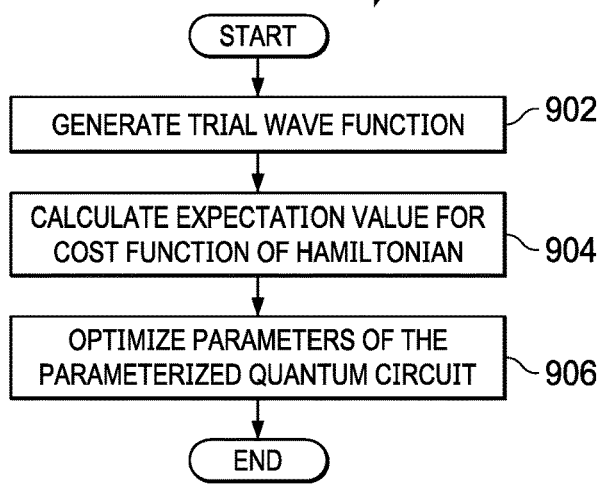
FIG. 9 depicts a flow diagram illustrating a process flow for the VQE algorithm in accordance with an illustrative embodiment.

FIG. 9 depicts a flow diagram illustrating a process flow for the VQE algorithm in accordance with an illustrative embodiment. Process flow 900 is a more detailed view of operation 812 in FIG. 8.

Process 900 begins by generating a trial wave function by the parameterized quantum circuit (operation 902), which is used to calculate an expectation value for the cost function (operation 904).

A classical optimizer then optimizes a number of parameters of the parameterized quantum circuit (operation 906). Optimal parameters correspond to values that generate the minimal value of the cost function. Process 900 then ends.

Figure 10:
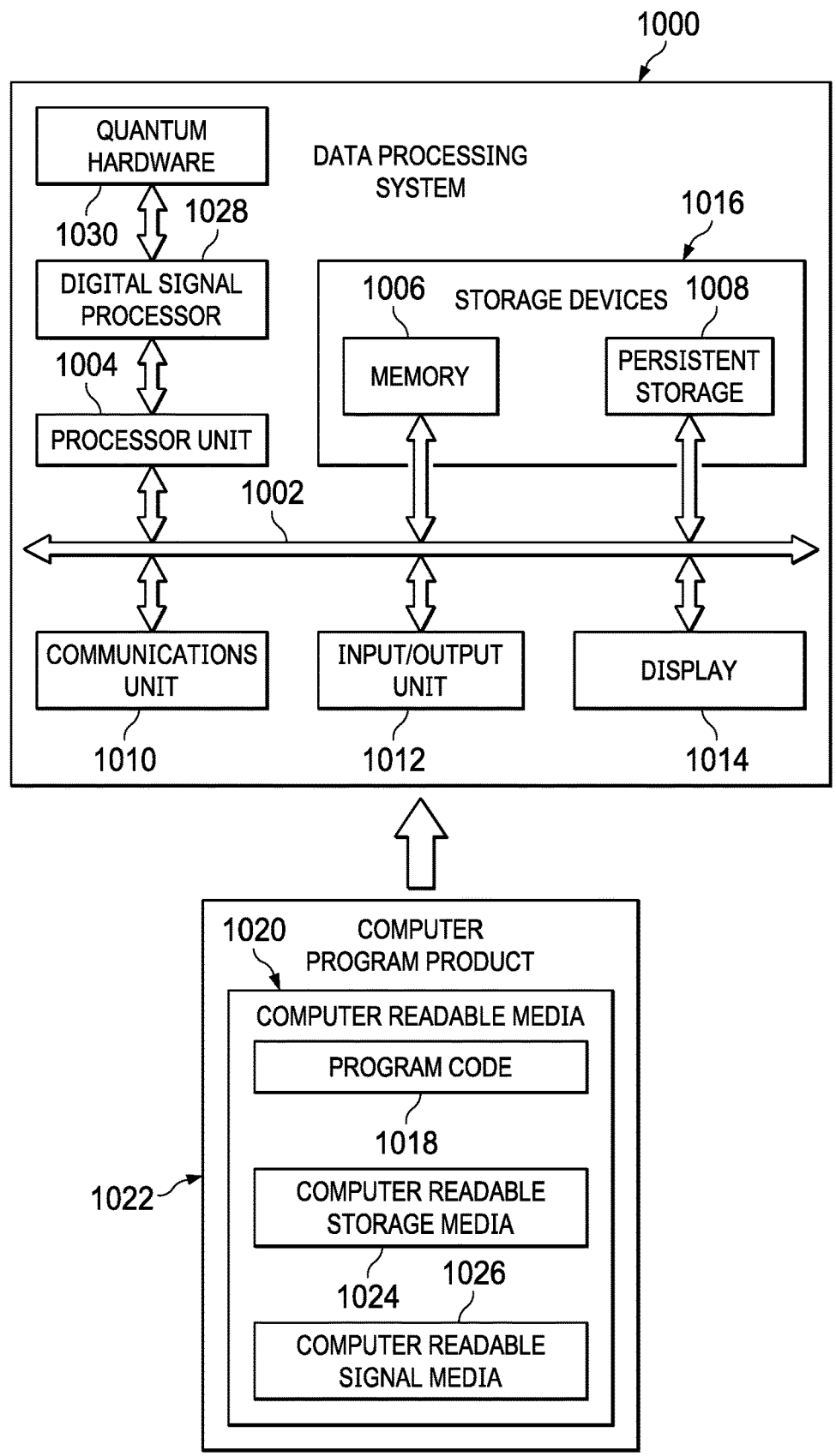
FIG. 10 depicts a block diagram of a data processing system in accordance with an illustrative embodiment.

Turning now to FIG. 10, an illustration of a block diagram of a data processing system is depicted in accordance with an illustrative embodiment. Data processing system might be an example of computer system 250 in FIG. 2. Data processing system 1000 might be used to implement VQE search algorithm 300 in FIG. 3 and process 800 in FIG. 8. In this illustrative example, data processing system 1000 includes communications framework 1002, which provides communications between processor unit 1004, memory 1006, persistent storage 1008, communications unit 1010, input/output unit 1012, and display 1014. In this example, communications framework 1002 may take the form of a bus system.

Processor unit 1004 serves to execute instructions for software that may be loaded into memory 1006. Processor unit 1004 may be a number of processors, a multi-processor core, or some other type of processor, depending on the particular implementation. In an embodiment, processor unit 1004 comprises one or more conventional general-purpose central processing units (CPUs). Processor unit 1004 may send instructions to and from digital signal processor (DSP) 1028. DSP 1028 in turn sends analog or hybrid signals to and from quantum hardware 1030.

Quantum hardware 1030 may comprise quantum circuits based on qubits (quantum bits). Qubits are traditionally used to simulate a 1 or 0 state, or in a superposition of the 1 and 0 states. However, when measured, the qubit may be in an infinite number of states depending on the qubit's quantum state immediately prior to measurement when using a Bloch sphere representation. The quantum circuits may comprise arbitrary single and two qubit gates that form a universal set with respect to the particular quantum computer in used.

Memory 1006 and persistent storage 1008 are examples of storage devices 1016. A storage device is any piece of hardware that is capable of storing information, such as, for example, without limitation, at least one of data, program code in functional form, or other suitable information either on a temporary basis, a permanent basis, or both on a temporary basis and a permanent basis. Storage devices 1016 may also be referred to as computer-readable storage devices in these illustrative examples. Memory 1006, in these examples, may be, for example, a random access memory or any other suitable volatile or non-volatile storage device. Persistent storage 1008 may take various forms, depending on the particular implementation.

For example, persistent storage 1008 may contain one or more components or devices. For example, persistent storage 1008 may be a hard drive, a flash memory, a rewritable optical disk, a rewritable magnetic tape, or some combination of the above. The media used by persistent storage 1008 also may be removable. For example, a removable hard drive may be used for persistent storage 1008. Communications unit 1010, in these illustrative examples, provides for communications with other data processing systems or devices. In these illustrative examples, communications unit 1010 is a network interface card.

Input/output unit 1012 allows for input and output of data with other devices that may be connected to data processing system 1000. For example, input/output unit 1012 may provide a connection for user input through at least one of a keyboard, a mouse, or some other suitable input device. Further, input/output unit 1012 may send output to a printer. Display 1014 provides a mechanism to display information to a user.

Instructions for at least one of the operating system, applications, or programs may be located in storage devices 1016, which are in communication with processor unit 1004 through communications framework 1002. The processes of the different embodiments may be performed by processor unit 1004 using computer-implemented instructions, which may be located in a memory, such as memory 1006.

These instructions are referred to as program code, computer-usable program code, or computer-readable program code that may be read and executed by a processor in processor unit 1004. The program code in the different embodiments may be embodied on different physical or computer-readable storage media, such as memory 1006 or persistent storage 1008.

Program code 1018 is located in a functional form on computer-readable media 1020 that is selectively removable and may be loaded onto or transferred to data processing system 1000 for execution by processor unit 1004. Program code 1018 and computer-readable media 1020 form computer program product 1022 in these illustrative examples. Computer program product 1022 might be for aligning reference frames for an augmented reality (AR) display. In one example, computer-readable media 1020 may be computer-readable storage media 1024 or computer-readable signal media 1026.

In these illustrative examples, computer-readable storage media 1024 is a physical or tangible storage device used to store program code 1018 rather than a medium that propagates or transmits program code 1018. Alternatively, program code 1018 may be transferred to data processing system 1000 using computer-readable signal media 1026.

Computer-readable signal media 1026 may be, for example, a propagated data signal containing program code 1018. For example, computer-readable signal media 1026 may be at least one of an electromagnetic signal, an optical signal, or any other suitable type of signal. These signals may be transmitted over at least one of communications links, such as wireless communications links, optical fiber cable, coaxial cable, a wire, or any other suitable type of communications link.

The different components illustrated for data processing system 1000 are not meant to provide architectural limitations to the manner in which different embodiments may be implemented. The different illustrative embodiments may be implemented in a data processing system including components in addition to or in place of those illustrated for data processing system 1000. Other components shown in FIG. 10 can be varied from the illustrative examples shown. The different embodiments may be implemented using any hardware device or system capable of running program code 1018.

As used herein, a first component "connected to" a second component means that the first component can be connected directly or indirectly to the second component. In other words, additional components may be present between the first component and the second component. The first component is considered to be indirectly connected to the second component when one or more additional components are present between the two components. When the first component is directly connected to the second component, no additional components are present between the two components.

As used herein, the phrase "a number" means one or more. The phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item C. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent at least one of a module, a segment, a function, or a portion of an operation or step. For example, one or more of the blocks may be implemented as program code.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

The description of the different illustrative embodiments has been presented for purposes of illustration and description and is not intended to be exhaustive or limited to the embodiments in the form disclosed. Many modifications and variations will be apparent to those of ordinary skill in the art. Further, different illustrative embodiments may provide different features as compared to other illustrative embodiments.

The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A computer-implemented method of minimizing a cost function of a quantum computation, the method comprising:
using a number of processors to perform the steps of:
receiving input of an initial state of a quantum problem instance comprising a Hamiltonian with an associated cost function;
converting the Hamiltonian into a number of Pauli strings;
forming an operator pool from the Pauli strings;
ranking the Pauli strings in the operator pool according to how much they lower a value of the cost function with respect to the initial state; and
iteratively adding Pauli strings from the operator pool to a parameterized quantum circuit, in a manner to minimize circuit depth, until a variational quantum eigensolver (VQE) algorithm converges to an approximate ground state wave function generated by the parameterized quantum circuit.

2. The method of claim 1, wherein the Pauli strings in the operator pool are further ranked according to non-identity operator path length.

3. The method of claim 2, wherein Pauli strings with the same non-identity operator path length are grouped within a same equivalence class.

4. The method of claim 3, wherein Pauli strings within the same equivalence class are ranked according to maximum exterior identity path length.

5. The method of claim 1, wherein iteratively adding Pauli strings from the operator pool to the parameterized quantum circuit comprises:
adding a Pauli string from the operator pool to the parameterized quantum circuit according to rank;
running the VQE algorithm with the parameterized quantum circuit to determine if the VQE algorithm has reached convergence;
responsive to a determination that the VQE algorithm has not reached convergence, adding another Pauli string from the operator pool to the parameterized quantum circuit; and
responsive to a determination that the VQE algorithm has reached convergence or no Pauli strings remain in the operator pool, stopping iteration.

6. The method of claim 5, wherein a new Pauli string added to the parameterized quantum circuit from the operator pool is selected to:
maximize overlap of identity operators in the new Pauli string with non-identity operators in the last added Pauli string; and
maximize overlap of non-identity operators in the new Pauli string with identity operators in the last added Pauli string.

7. The method of claim 5, wherein running the VQE comprises:
generating, by the parameterized quantum circuit, a trial wave function;
calculating an expectation value for the cost function based on the trial wave function; and
optimizing, by a classical optimizer, a number of parameters of the parameterized quantum circuit, wherein optimal parameters correspond to values that generate a minimal value of the cost function.

8. The method of claim 1, wherein after a Pauli string from the operator pool is added to the parameterized quantum circuit it is discarded from the operator pool and not used again in future iterations.

9. The method of claim 1, wherein quantum gates in the parameterized quantum circuit correspond to non-identity operators in the Pauli strings.

10. A system for minimizing a cost function of a quantum computation, the system comprising:
a storage device configured to store program instructions; and
one or more processors operably connected to the storage device and configured to execute the program instructions to cause the system to:
receive input of an initial state of a quantum problem instance comprising a Hamiltonian with an associated cost function;
convert the Hamiltonian into a number of Pauli strings;
form an operator pool from the Pauli strings;
rank the Pauli strings in the operator pool according to how much they lower a value of the cost function with respect to the initial state; and
iteratively add Pauli strings from the operator pool to a parameterized quantum circuit, in a manner to minimize circuit depth, until a variational quantum eigensolver (VQE) algorithm converges to an approximate ground state wave function generated by the parameterized quantum circuit.

11. The system of claim 10, wherein the Pauli strings in the operator pool are further ranked according to non-identity operator path length.

12. The system of claim 11, wherein Pauli strings with the same non-identity operator path length are grouped within a same equivalence class.

13. The system of claim 12, wherein Pauli strings within the same equivalence class are ranked according to maximum exterior identity path length.

14. The system of claim 10, wherein iteratively adding Pauli strings from the operator pool to the parameterized quantum circuit comprises:
adding a Pauli string from the operator pool to the parameterized quantum circuit according to rank;
running the VQE algorithm with the parameterized quantum circuit to determine if the VQE algorithm has reached convergence;
responsive to a determination that the VQE algorithm has not reached convergence, adding another Pauli string from the operator pool to the parameterized quantum circuit; and
responsive to a determination that the VQE algorithm has reached convergence or no Pauli strings remain in the operator pool, stopping iteration.

15. The system of claim 14, wherein a new Pauli string added to the parameterized quantum circuit from the operator pool is selected to:
maximize overlap of identity operators in the new Pauli string with non-identity operators in the last added Pauli string; and
maximize overlap of non-identity operators in the new Pauli string with identity operators in the last added Pauli string.

16. The system of claim 14, wherein running the VQE comprises:
generating, by the parameterized quantum circuit, a trial wave function;

calculating an expectation value for the cost function based on the trial wave function; and optimizing, by a classical optimizer, a number of parameters of the parameterized quantum circuit, wherein optimal parameters correspond to values that generate a minimal value of the cost function.

17. The system of claim 10, wherein after a Pauli string from the operator pool is added to the parameterized quantum circuit it is discarded from the operator pool and not used again in future iterations.

18. The system of claim 10, wherein quantum gates in the parameterized quantum circuit correspond to non-identity operators in the Pauli strings.

19. A computer program product for minimizing a cost function of a quantum computation, the computer program product comprising:
a computer-readable storage medium having program instructions embodied thereon to perform the steps of:
receiving input of an initial state of a quantum problem instance comprising a Hamiltonian with an associated cost function;
converting the Hamiltonian into a number of Pauli strings;
forming an operator pool from the Pauli strings;
ranking the Pauli strings in the operator pool according to how much they lower a value of the cost function with respect to the initial state; and
iteratively adding Pauli strings from the operator pool to a parameterized quantum circuit, in a manner to minimize circuit depth, until a variational quantum eigensolver (VQE) algorithm converges to an approximate ground state wave function generated by the parameterized quantum circuit.

20. The computer program product of claim 19, wherein the Pauli strings in the operator pool are further ranked according to non-identity operator path length.

21. The computer program product of claim 20, wherein Pauli strings with the same non-identity operator path length are grouped within a same equivalence class.

22. The computer program product of claim 21, wherein Pauli strings within the same equivalence class are ranked according to maximum exterior identity path length.

23. The computer program product of claim 19, wherein iteratively adding Pauli strings from the operator pool to the parameterized quantum circuit comprises:
adding a Pauli string from the operator pool to the parameterized quantum circuit according to rank;
running the VQE algorithm with the parameterized quantum circuit to determine if the VQE algorithm has reached convergence;
responsive to a determination that the VQE algorithm has not reached convergence, adding another Pauli string from the operator pool to the parameterized quantum circuit; and
responsive to a determination that the VQE algorithm has reached convergence or no Pauli strings remain in the operator pool, stopping iteration.

24. The computer program product of claim 23, wherein a new Pauli string added to the parameterized quantum circuit from the operator pool is selected to:
maximize overlap of identity operators in the new Pauli string with non-identity operators in the last added Pauli string; and
maximize overlap of non-identity operators in the new Pauli string with identity operators in the last added Pauli string.

25. The computer program product of claim 23, wherein running the VQE comprises:
generating, by the parameterized quantum circuit, a trial wave function;
calculating an expectation value for the cost function based on the trial wave function; and
optimizing, by a classical optimizer, a number of parameters of the parameterized quantum circuit, wherein optimal parameters correspond to values that generate a minimal value of the cost function.

26. The computer program product of claim 19, wherein after a Pauli string from the operator pool is added to the parameterized quantum circuit it is discarded from the operator pool and not used again in future iterations.

27. The computer program product of claim 19, wherein quantum gates in the parameterized quantum circuit correspond to non-identity operators in the Pauli strings.

* * * * *